United States Patent [19]
Penner et al.

[11] Patent Number: 5,683,945
[45] Date of Patent: Nov. 4, 1997

[54] UNIFORM TRENCH FILL RECESS BY MEANS OF ISOTROPIC ETCHING

[75] Inventors: Klaus Penner, Wappingers Falls, N.Y.; Hans-Joerg Timme, Taufkirchen, Germany

[73] Assignee: Siemens Aktiengesellschaft, Munich, Germany

[21] Appl. No.: 648,791

[22] Filed: May 16, 1996

[51] Int. Cl.⁶ ............................................. H01L 21/302
[52] U.S. Cl. ..................... 437/225; 437/67; 437/203; 148/DIG. 50
[58] Field of Search .................. 437/67, 68, 225, 437/228, 203, 52; 148/DIG. 50

[56] References Cited

U.S. PATENT DOCUMENTS

| | | | |
|---|---|---|---|
| 5,006,482 | 4/1991 | Kerbaugh et al. | 437/203 |
| 5,229,316 | 7/1993 | Lee et al. | 437/67 |
| 5,270,265 | 12/1993 | Hemmenway et al. | 437/67 |
| 5,406,515 | 4/1995 | Rajeevakumar | 365/182 |
| 5,422,294 | 6/1995 | Noble, Jr. | 437/52 |
| 5,540,811 | 7/1996 | Morita | 437/225 |

*Primary Examiner*—Jey Tsai
*Attorney, Agent, or Firm*—Donald B. Paschburg

[57] ABSTRACT

A procedure for forming uniformly recessed fills of trench structures that maintains a planar wafer surface without need of any intermediate or final planarization technique. The procedure relies on isotropical etches with high selectivities and the presence of a sacrificial layer. Its only design requirement is that all trenches must at least have one dimension smaller than twice the recess depth.

9 Claims, 5 Drawing Sheets

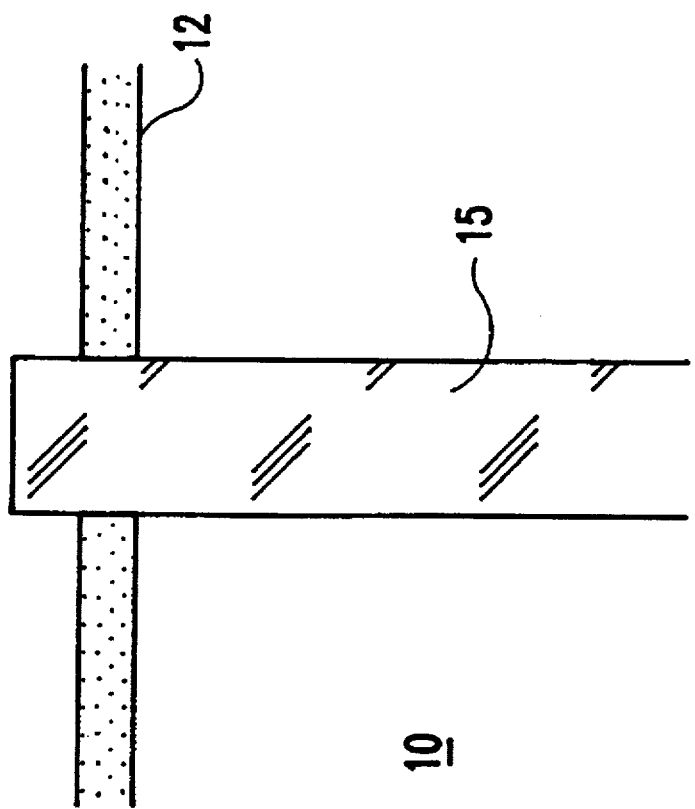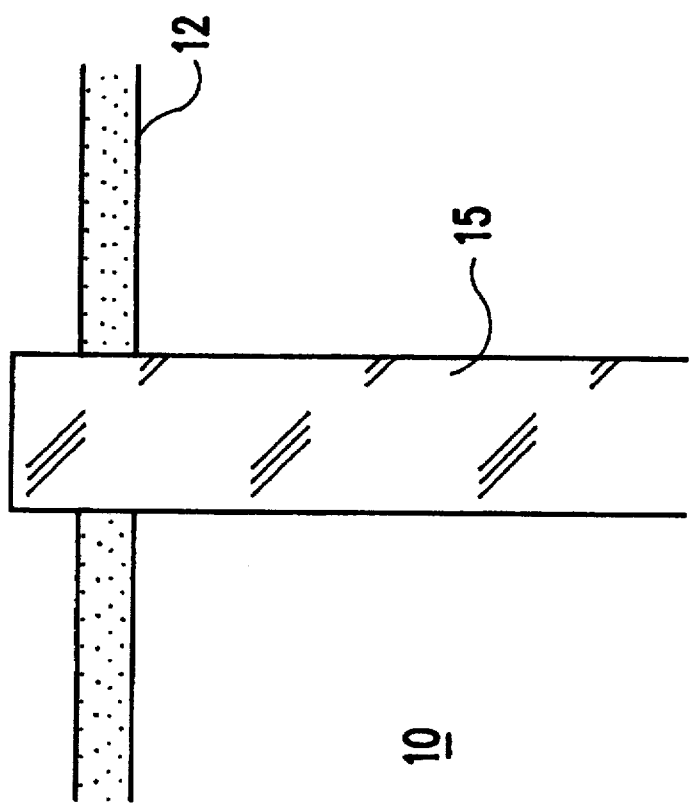
FIG. 3

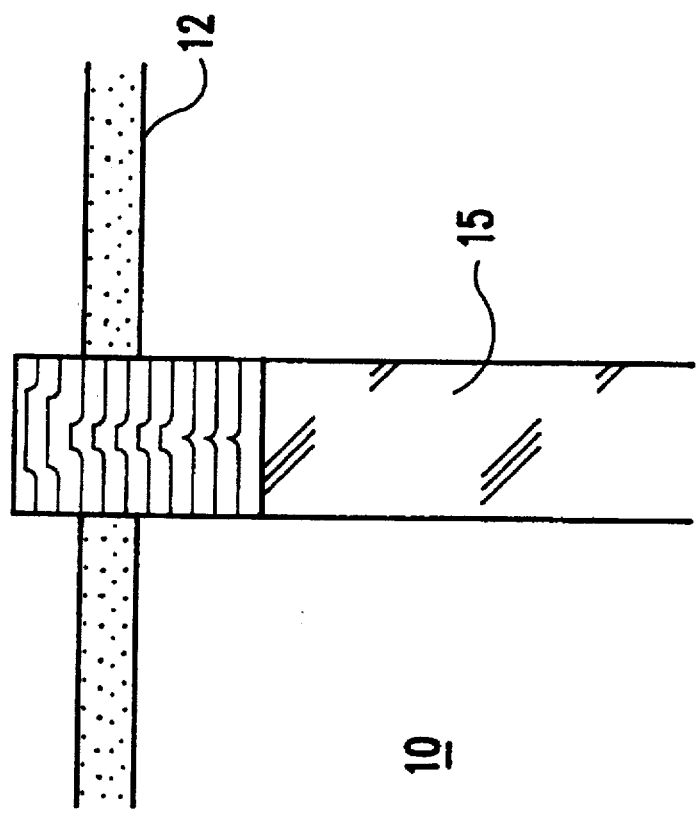
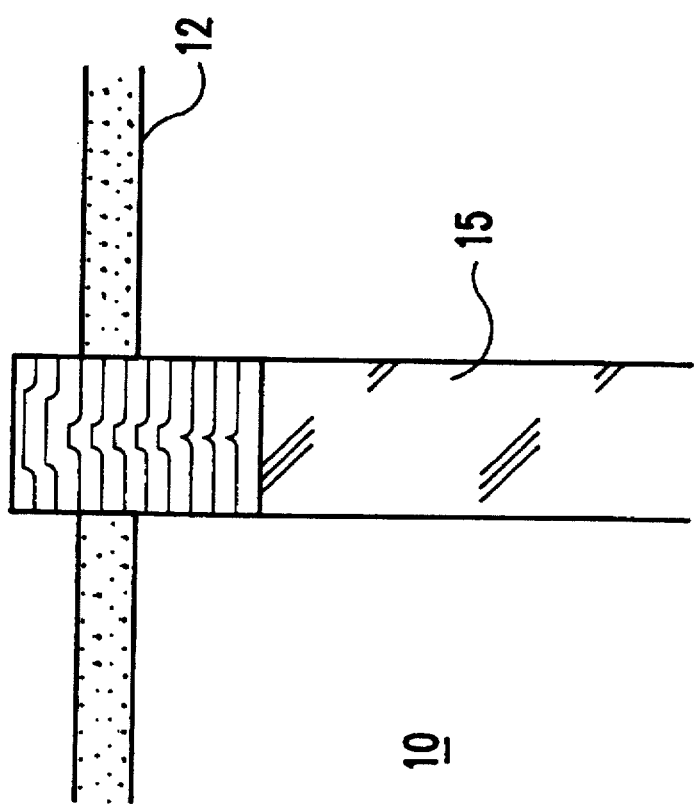
FIG. 4

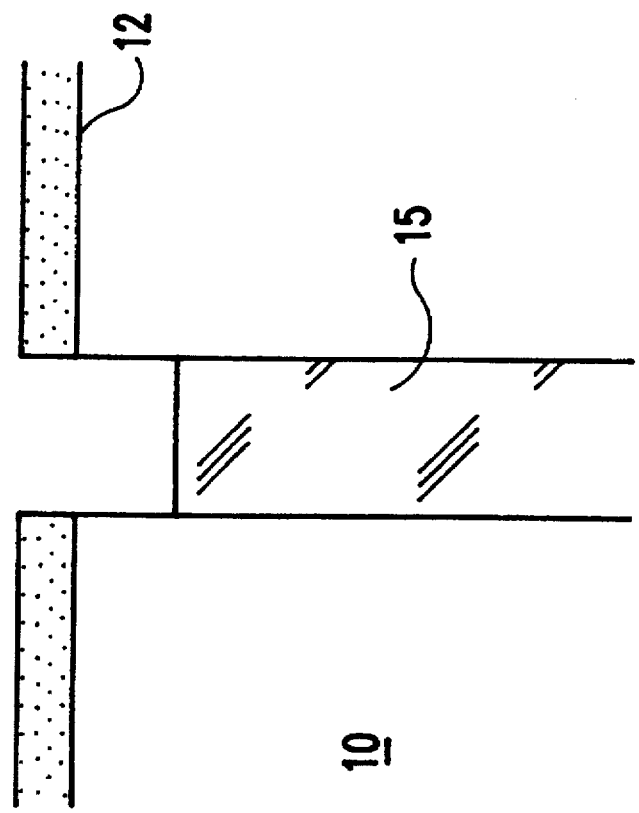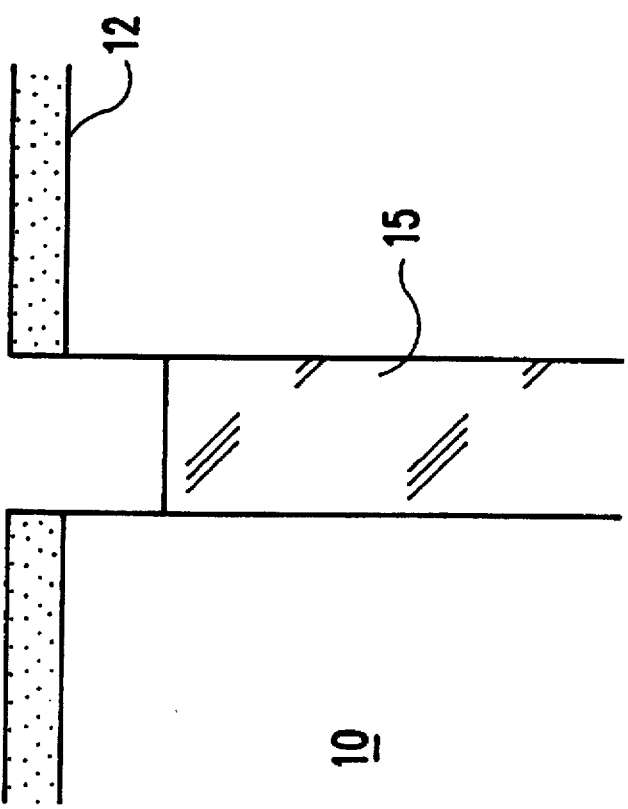
FIG.5

UNIFORM TRENCH FILL RECESS BY MEANS OF ISOTROPIC ETCHING

BACKGROUND OF THE INVENTION

1. Field of the Invention

The present invention generally relates to the manufacture of microelectronic circuits in semiconductor substrates such as silicon wafers and, more particularly, to a process which achieves a uniform trench fill recess starting from a non-planar surface without the need for planarization techniques.

2. Description of the Prior Art

In the manufacture of microelectronic devices in very large scale integrated (VLSI) circuits, there is often the need to uniformly recess trench fills. Applications of such structures include the polysilicon fill of trench capacitors in advanced dynamic random access memory (DRAM) structures. A recess of such polysilicon fills is for example necessary in order to perform collar isolations near the wafer surface (i.e., active area), or to form a buried highly-doped layer.

Conventional trench fill recess processes require previous planarization of the wafer surface in order to be uniform. In the prior art, uniformity of the surface was either neglected resulting in a nonuniform recess process with significant variations over the wafer and different chip areas, or several process steps had to be done in order to ensure a planar surface before doing the recess process. This could be a sequence of a chemical-mechanical polish (CMP) step to polish the fill down to the adjacent layer followed by the etch of this layer and a final CMP step to polish down to an underlying layer, establishing a planar surface. This procedure involves several wafer cleaning steps as well as a rather lengthy process sequence.

SUMMARY OF THE INVENTION

It is therefore an object of the present invention to provide a new procedure for forming uniform trench fill recesses without previous planarization processes being required.

It is another object of the invention to provide a procedure for forming uniformly recessed fills of trench structures which maintains a planar wafer surface without need of any intermediate or final planarization technique.

According to the invention, there is provided a procedure for obtaining uniformly recessed fills of trench structures with at least a smallest dimension smaller than double the desired recess depth. The invention relies on isotropical etches with high selectivities and the presence of a sacrificial layer. The only design requirement is that all trenches must at least have one dimension smaller than twice the recess depth. This requirement is for example fulfilled in DRAM trench capacitor structures.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is a cross-sectional view showing the second step of the process according to the invention;

FIG. 4 is a cross-section view showing the third step of the process according to the invention; and FIG. 5 is a cross-sectional view showing the final structure produced by the process according to the invention.

DETAILED DESCRIPTION OF THE INVENTION

Figure 1:
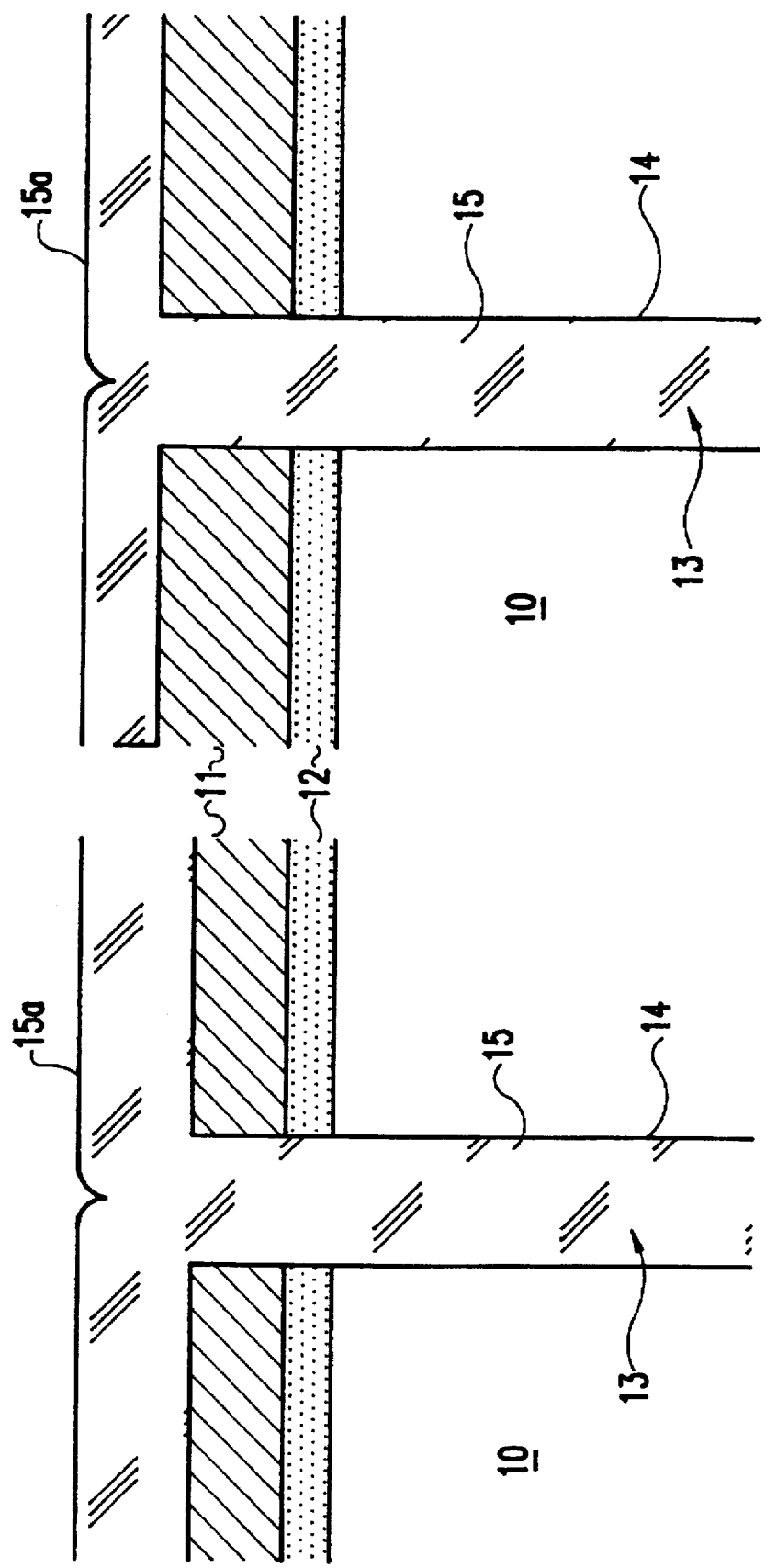
FIG. 1 is a cross-sectional view showing the starting structure used in the practice of the invention.

Referring now to the drawings, and more particularly to FIG. 1, there is shown a structure comprising a planar wafer substrate 10 with multiple layers 11 and 12. The wafer substrate 10 is silicon, and the layers 11 and 12 may be, for example, an oxide or silica glass as a sacrificial layer and silicon nitride, respectively. In the illustration of FIG. 1, the left hand side differs from the right hand side by the thickness of layer 11 to represent the non-planar surface of layer 11. The layers 11 and 12 serve both as etch mask for the trench formation (using nonisotropic dry etch like reactive ion etch (RIE), for example) and also as a barrier layer for the subsequent isotropical etch processes described below (i.e., wet etching or chemical dry etching (CDE)). The layers 11 and 12 can be a single layer, a double layer or a multiple layers consisting of three or more layers. In the following description, a double layer is assumed.

Trench 13 are formed in this structure, and a sidewall passivation layer 14, for example (reoxidized) silicon nitride, between the bulk silicon of the wafer substrate and trench sidewalls is formed. A fill 15 may be required to allow selective etching of the fill 15 with respect to the wafer substrate 10, depending on the materials of the fill 15 and of the wafer substrate 10. The fill 15 may be, for example, polysilicon or a photoresist. Note that the passivation layer 14 can actually be multiple layers.

The layer 12 should be as planar as possible, where layer 11 might be of non-uniform thickness (as shown) before or after trench etching (i.e., caused by erosion, for example). It is further assumed that the fill 15 fills the trench 13 completely with some overfill, and that the fill is free of voids or seams at least in the top part of the trench that has to be recessed later. The thickness of the filling film 15a overlying layer 11 is basically determined by the smallest trench dimension and by the requirement for some overfill. The surface topography of filling film 15a can be non-planar due to erosion of the etch mask 11 or microloading effects in the deposition of the film, for example.

Figure 2:
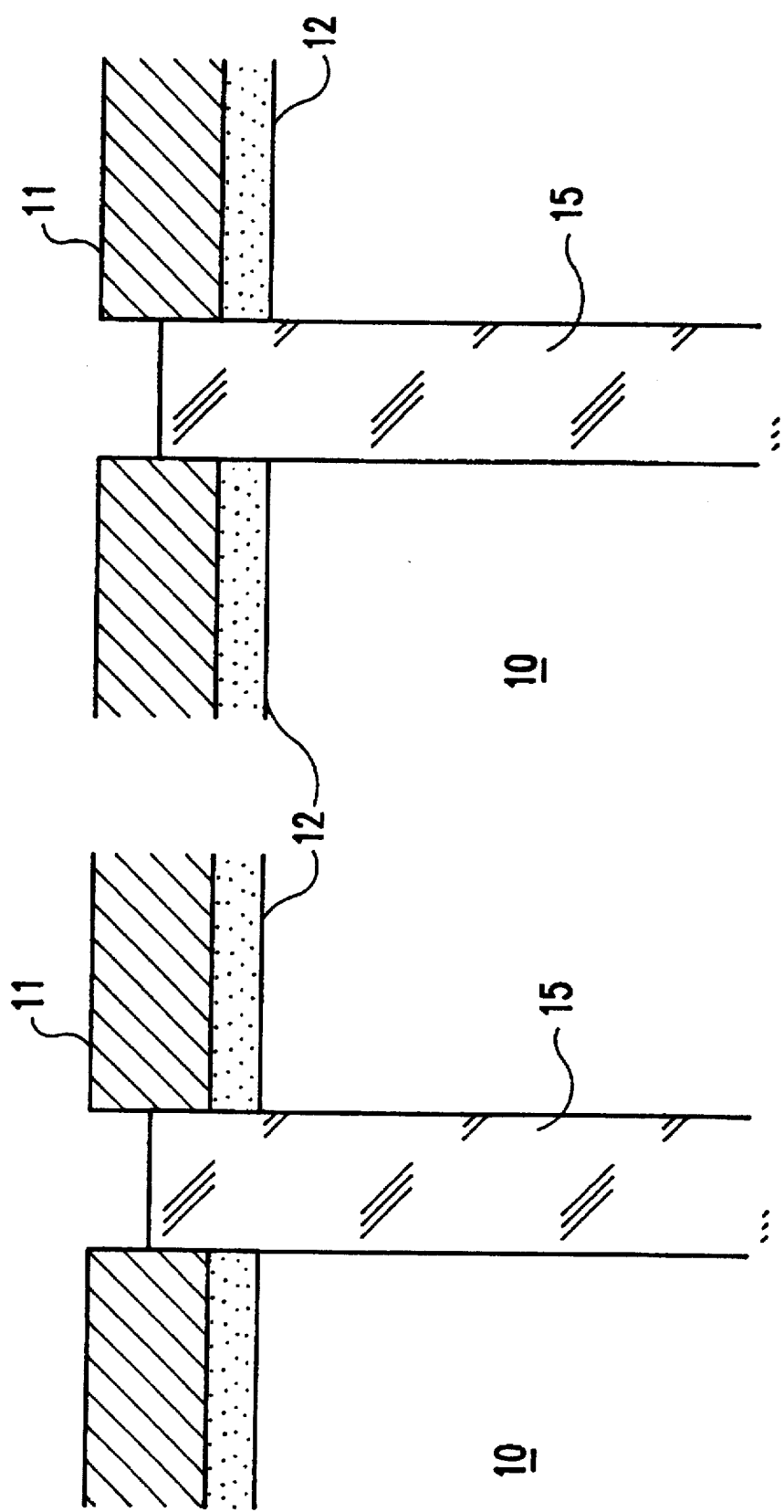
FIG. 2 is a cross-sectional view showing the first step in the process according to the invention.

In a first step shown in FIG. 2, the filling film 15a on top of the structure is isotropically etched with high selectivity to the underlying layer 11 (or layer 14 if on top of layer 11). This isotropical etch can be performed as a wet etch (i.e., in a tank tool or a spin etch tool) or by CDE. Etch rate and etch time have to be adjusted in such a way that the film 15a is removed from the layer 11, but that the trench fill 15 is not etched below the interface between layers 11 and 12 or layer 11 and wafer 10, respectively. The minimal thickness of the layer 11 is determined by the requirements for its use as a trench etch mask in the first place. However, a larger thickness of layer 11 can be chosen in order to guarantee that the above criterion is satisfied.

As shown in FIG. 3, the layer 11 is now removed by an isotropical etch selective to the trench fill 15. If a trench sidewall film 14 is present that also covers layer 11, this sidewall film 14 has to be removed prior to etching layer 11. This etch can be performed as a wet etch or by CDE. As a result, small studs of trench fill 15 will remain above the surface of the remaining structure, with top layer 12, for example. For best uniformity results in the next step, all fill stud surface points should be above the surface of the remaining structure; i.e., of layer 12.

The final step performs the uniform trench fill recess. It is again an isotropical etch, this time highly selective with respect to either surface layer 12 and the sidewall film 14 or, alternatively, to the bulk of wafer substrate 10 (in which case a layer 12 would only be required if layer 11 could not be etched selectively to the wafer substrate material). All recesses will be uniformly deep if the smallest dimension of the trenches is smaller than or equal to twice the recess depth, as shown in FIG. 4. The recess depth is determined by etch rate and etch time. The final result is shown in FIG. 5.

It is possible to apply one or several chemical-mechanical polishing (CMP) steps between the above described process steps. For example, the remaining fill studs after step the step shown in FIG. 3 can be removed by means of CMP before the final trench fill recess.

The filling film 15a may also be a resist (photoresist), etched by a mixture of sulfuric acid and hydrogen peroxide ("Piranha") or by CDE. The sac. layer 12 could be etched by a concentrated buffered hydrofluoric acid ("BHF"). The application would be the formation of an etch mask covering uniformly the lower part of the trench in order to etch a previously deposited sidewall film only in the upper part of the trench.

The filling film 15a could also be a silicon oxide e.g. for isolating purposes. In that case, either a different sacrificial layer which could be etched selectively to the fill would be needed or a sidewall passivation layer is necessary to provide for selective etching of the fill.

The etchand of a silca glass fill can be hydrofluoric acid in concentrated form or buffered or both in any dilution.

The etchand of a polysilicon film could be (beneath KOH) a mixture of nitric acid and hydrofluoric acid.

The invention thus provides a simple method of uniform trench fill recess by using a sacrificial layer and selective isotropic etching. This process requires no previous planarization technique which greatly reduces the cost of manufacture.

EXAMPLE

In a first step, the film 15a on top of the structure is a polysilicon film with a maximum thickness of 500 nm and is etched using potassium hydroxide (KOH) with an etch rate of approximately 6 nm/min. The etch time is chosen in a way to stop somewhere above a 200 nm thick nitride layer 12 but below the surface of a tetraethylorthosilane (TEOS) oxidation layer 11 which can vary in thickness between 700 nm and almost nothing. Outside the trenches, the etch will stop on top of the TEOS layer 11 due to the high selectivity of the etch to the layer. The TEOS layer 11 is now removed by a wet etch in buffered hydrofluoric (HF) acid. This etch is selective to the polysilicon film 15 and the underlying nitride layer 12, resulting in small studs of the polysilicon fill 15 with different heights on an otherwise planar nitride surface. The timing of this step is uncritical because of the high selectivity to the surrounding materials.

The final step is again a wet etch in KOH timed to etch the amount of polysilicon from the top of the nitride layer 12 to the chosen recess depth, which has to be at least half the trench width but which can extend much deeper. Since the etchant attacks the polysilicon studs from the side as well as from the top (see FIG. 4), the studs will get thinner and finally be etched away leaving a uniformly deep recessed trench fill.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A procedure for forming uniformly recessed fills of trench structures which maintains a planar wafer surface without need of any intermediate or final planarization technique comprising the steps of:

providing an initial structure comprising at least a sacrificial layer over a substrate wherein said sacrificial layer may be non-uniform, said structure further comprising a plurality of trenches formed in said sacrificial layer and extending into said substrate and a fill material deposited over said sacrificial layer and filling said trenches, said trenches having a smallest dimension smaller than or equal to twice a desired recess depth;

isotropically etching said fill material to remove the fill material from said sacrificial layer but not below an interface of the sacrificial layer;

removing said sacrificial layer by an isotropical etch selective to the fill material to leave projecting studs of fill material; and isotropically etching the projecting studs of fill material with an etch that is highly selective to said wafer to produce a uniform depth in each of said trenches.

2. The procedure recited in claim 1 wherein said initial structure further comprises a sidewall film formed in said trenches prior to filling said trenches with said fill material, said sidewall film ensuring selectivity of the recess etch to the substrate.

3. The procedure recited in claim 1 wherein said fill material forms a nonuniform layer on top of said sacrificial layer, adding additional non-uniformity to said initial structure.

4. A procedure for forming uniformly recessed fills of trench structures which maintains a planar wafer surface without need of any intermediate or final planarization technique comprising the steps of:

forming at least a sacrificial layer over a substrate wherein said sacrificial layer may be non-uniform;

forming a plurality of trenches in said sacrificial layer and extending into said substrate, said trenches having a smallest dimension smaller than or equal to twice a desired recess depth;

depositing a fill material over said sacrificial layer and filling said trenches;

isotropically etching said fill material to remove the fill material from said sacrificial layer but not below an interface of the sacrificial layer;

removing said sacrificial layer by an isotropical etch selective to the fill material to leave projecting studs of fill material; and isotropically etching the projecting studs of fill material with an etch that is highly selective to said wafer to produce a uniform depth in each of said trenches.

5. The procedure recited in claim 4 further comprising depositing an insulating layer over said substrate before forming said sacrificial layer over said substrate and wherein the step of isotropically etching said fill material results in said fill material not being removed below an interface between said sacrificial layer and said insulating layer.

6. The procedure recited in claim 5 wherein said substrate is silicon and said insulating layer is silicon nitride, said silicon nitride layer being substantially planar.

7. The procedure recited in claim 6 wherein said sacrificial layer is a tetraethylorthosilane (TEOS) oxidation layer and said fill material is polysilicon, said step of isotropically etching said fill material being performed with potassium hydroxide for an etch time chosen so that the etch stops before reaching said silicon nitride layer.

8. The procedure recited in claim 7 wherein said step of removing said sacrificial layer is performed with buffered hydrofluoric acid.

9. The procedure recited in claim 4 further comprising the step of forming a sidewall film in said trenches prior to filling said trenches with said fill material, said sidewall film ensuring selectivity of the recess etch to the substrate during the step of isotropically etching the projecting studs.

* * * * *